(12) United States Patent
Faucett et al.

(10) Patent No.: US 8,289,714 B2
(45) Date of Patent: Oct. 16, 2012

(54) RUGGEDIZED COMPUTER AND ASPECTS THEREOF

(75) Inventors: Tim Faucett, Oregon City, OR (US); Scott Westfall, Beavercreek, OR (US)

(73) Assignee: APlus Mobile Inc., Oregon City, OR (US)

( * ) Notice: Subject to any disclaimer, the term of this patent is extended or adjusted under 35 U.S.C. 154(b) by 190 days.

(21) Appl. No.: 12/834,630

(22) Filed: Jul. 12, 2010

(65) Prior Publication Data

US 2012/0008283 A1 Jan. 12, 2012

Related U.S. Application Data

(63) Continuation of application No. 12/319,259, filed on Jan. 5, 2009, now Pat. No. 7,773,375.

(60) Provisional application No. 61/019,207, filed on Jan. 4, 2008, provisional application No. 61/019,209, filed on Jan. 4, 2008.

(51) Int. Cl.
*H05K 7/20* (2006.01)
*F28F 9/00* (2006.01)

(52) U.S. Cl. ........ 361/719; 361/704; 361/710; 361/714; 165/80.3; 165/185

(58) Field of Classification Search ............ 361/679.46, 361/679.54, 690–697, 704–714, 719–724, 361/8; 165/80.3, 80.4, 104.33, 104, 34, 185; 312/223.2, 223.3; 174/16.1, 16.3, 252; 257/706–727

See application file for complete search history.

(56) References Cited

U.S. PATENT DOCUMENTS

| | | | | | |
|---|---|---|---|---|---|
| 4,770,242 | A | * | 9/1988 | Daikoku et al. | 165/185 |
| 5,052,481 | A | * | 10/1991 | Horvath et al. | 165/185 |
| 5,133,403 | A | * | 7/1992 | Yokono et al. | 165/185 |
| 5,345,107 | A | * | 9/1994 | Daikoku et al. | 257/717 |
| 5,774,334 | A | * | 6/1998 | Kawamura et al. | 361/699 |
| 6,101,090 | A | * | 8/2000 | Gates | 361/690 |
| 6,185,101 | B1 | * | 2/2001 | Itabashi et al. | 361/704 |
| 6,738,258 | B2 | * | 5/2004 | Bijlenga et al. | 361/704 |
| 7,277,291 | B2 | * | 10/2007 | Ross et al. | 361/710 |
| 7,447,017 | B2 | * | 11/2008 | Koo | 361/688 |
| 8,031,464 | B2 | * | 10/2011 | Adkins et al. | 361/679.47 |
| 2004/0257769 | A1 | * | 12/2004 | Heirich et al. | 361/704 |
| 2010/0142154 | A1 | * | 6/2010 | Collet et al. | 361/714 |

* cited by examiner

*Primary Examiner* — Michail V Datskovskiy
(74) *Attorney, Agent, or Firm* — Timothy E Siegel Patent Law, PLLC; Timothy E Siegel

(57) ABSTRACT

A mechanical and thermal assembly adapted to absorb heat from a delicate, heat-producing structure having a planar surface includes a slide plate in thermal contact to said planar surface, and being held in place by a resilient system that permits, but gently resists, movement perpendicular to said planar surface and a thermal mass, suspended over said slide plate, but in thermal contact to said slide plate, so that said delicate, heat-producing structure is not damaged due to force applied from said thermal mass through said slide plate to said structure.

20 Claims, 6 Drawing Sheets

RUGGEDIZED COMPUTER AND ASPECTS THEREOF

RELATED APPLICATIONS

This application is a continuation of application Ser. No. 12/319,259, filed Jan. 5, 2009, now U.S. Pat. No. 7,773,375 which in turn claims priority from provisional applications 61/019,207 and 61/019,209, both filed Jan. 4, 2008 and both hereby incorporated by reference as if fully set forth herein.

TECHNICAL FIELD

The present disclosure is related to a ruggedized electrical device, able to operate reliably from a power bus that suffers intermittent voltage reductions and aspects thereof. More specifically, the electrical device may be a computer.

BACKGROUND

In vehicles and devices there is an increasing need for a rugged computer assembly that is isolated from the elements and that can function with high reliability even though powered by a bus that is intermittently unable to meet the full power demand placed upon it.

SUMMARY

The embodiments described below generally address the need for a ruggedized computer that can be deployed in a physical environment where it receives physical impacts and where it may have gases, liquids and solid/liquid mixtures (eg. mud) contacting its outside surfaces. Also, available electrical power may be subject to intermittent failure. Many issues arise in the design of this type of device, and many of the solutions to these issues may find application in other fields.

DETAILED DESCRIPTION

Several aspects of the present disclosure are directed to aspects of a rugged computer assembly that can function with high reliability even when supplied by a bus that intermittently fails to meet power demand. Skilled persons will understand that additional embodiments may be practiced without several of the details described below, and that other embodiments may include aspects in addition to those described below.

Figure 1:
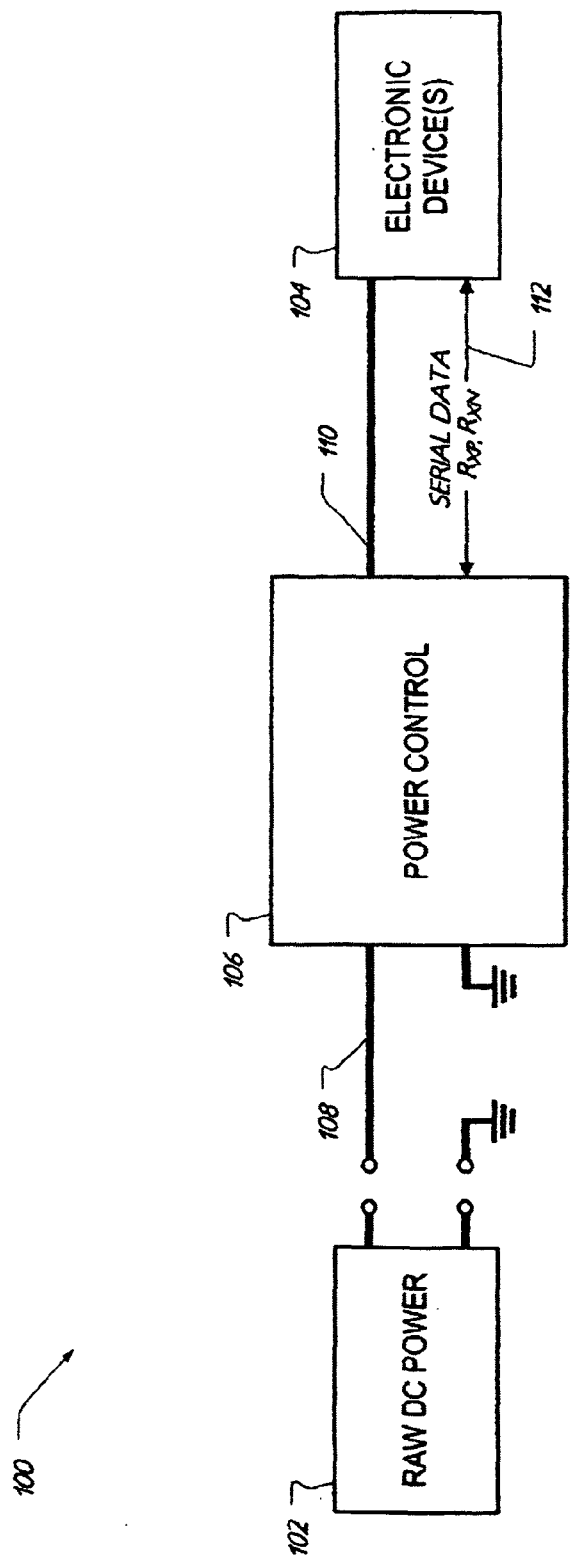
FIG. 1 is schematic diagram of a mobile power system employing a power supply unit configured in accordance with an embodiment of the disclosure.

FIG. 1 is a schematic diagram of a mobile power system 100 including a DC power source 102, one or more electronic devices 104, and a power supply unit 106 that can operably couple the power source 102 with the electronic devices 104 via input and output power busses 108 and 110. In several embodiments, the power supply unit 106 can also exchange serial data with the electronic devices 104 via a serial link 112 (described further with reference to FIG. 4). In general, the power source 102 provides raw DC power, and can include a variety of elements, such as a battery, an alternator, and/or any one of various types of AC-to-DC converters. In many embodiments, the electronic devices 104 include any of a myriad of consumer electronic devices that are configured to receive DC power (e.g., a personal computer, a mobile phone, a GPS unit, etc.).

In other embodiments, the electronic devices 104 can be incorporated and/or integrated with the power supply unit 106. Such a combination can be deployed as a single unit, for example, as a computing device that can be energized by the (raw) DC power source on input bus 108 without any intervening components. In addition, embodiments of this type of device can be deployed in a single rugged and protective housing, as described further below with reference to FIGS. 5 and 6.

Figure 2:
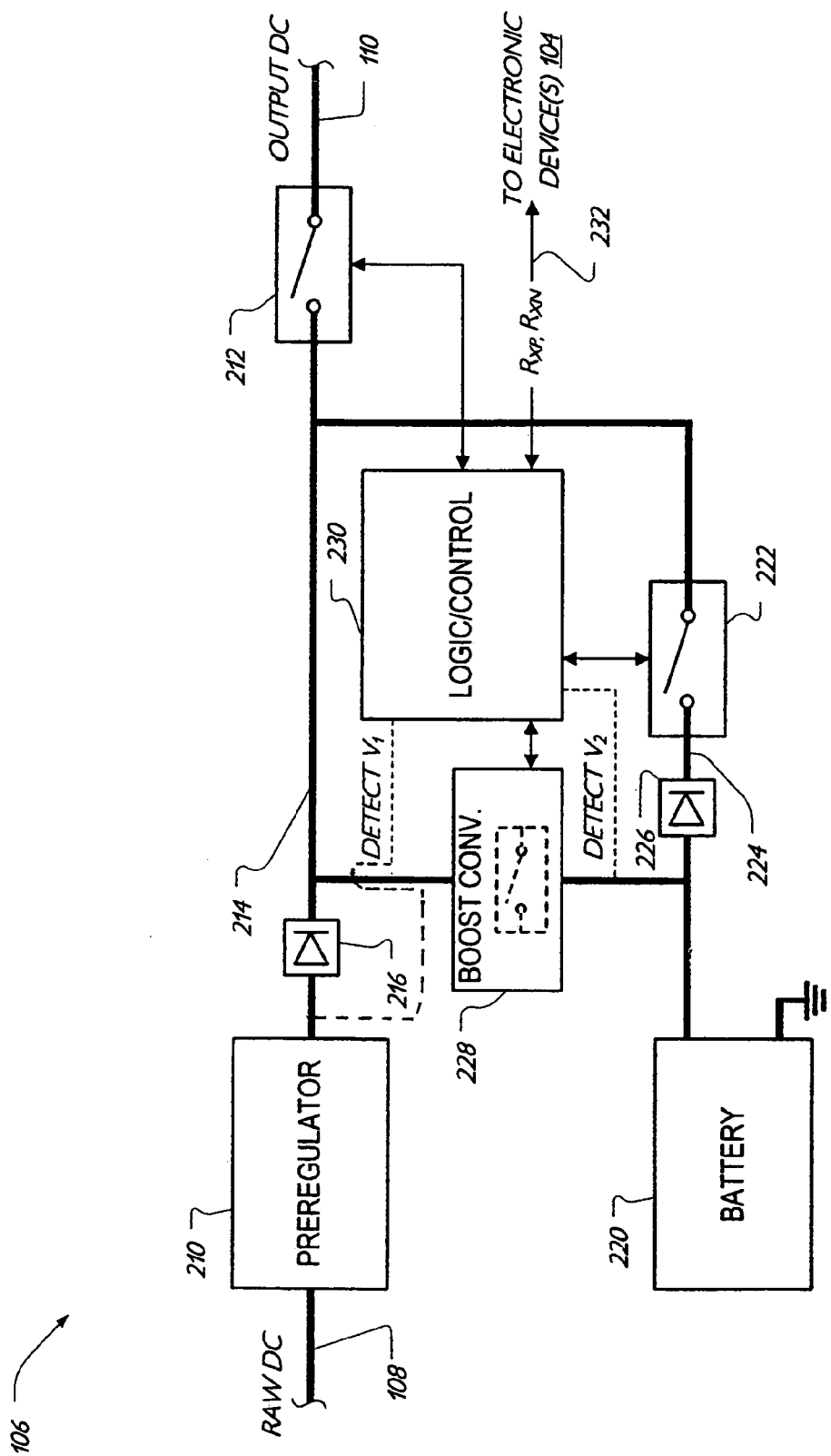
FIG. 2 is a schematic diagram illustrating the power supply unit of FIG. 1 in more detail.

FIG. 2 is a schematic diagram illustrating the power supply unit 106 in more detail. In the example shown in FIG. 2, the power supply unit 106 includes a preregulator 210 coupled to the input bus 108. For example, in an automobile electronic system, the voltage at the input bus 108 can be in a range of about −50 to +60V, and the preregulator 210 can step down this voltage to a range of about +8 to +22V. In several embodiments the preregulator 210 includes an automotive grade switching regulator to achieve this task. A preregulator output diode 216, couples the output of preregulator 210 to a first internal bus 214. In turn, a main switch 212 couples (and de-couples) bus 214 to output bus 110. The power supply unit 106 also includes a battery 220 (e.g., a sealed lead acid, NiMH, LiPo battery, or UPS battery system of sufficient current capability for the application), the positive terminal of which being connected to an output diode 226 terminal. The other terminal of diode 226 is connected to a second internal power bus 224. A boost converter 228 is electrically interposed between the first and second buses 214 and 224. For example, the boost converter 228 can output a regulated voltage in a range of about 13-14V, which can trickle charge a 12 V battery 220, or a range of 25 to 27V for charging a 24 V battery. A battery switch 222 is couples first bus 214 to second bus 224. In a representative embodiment, the power supply unit 106 includes a logic/control assembly 230 that controls the main switch 212, the battery switch 222, and the boost converter 226. In addition, the logic/control assembly 230 can also exchange serial communications 232 with the electronic devices 104. For example, the serial communications 232 can indicate events such as whether the battery 220 is recharging or whether the battery 220 is supplying power to the electric devices 104. Communications 232 can also provide a way to change other programmable power supply 106 features during operation such as program timing changes and trigger points and can even replace the entire program for the logic control assembly 230 with a newer version (described further with reference to FIG. 4).

The logic control/control assembly 230 generally operates the power supply unit 106 in one of at least two states of operation. In a first state of operation and/or when the preregulator output voltage V1 is at or above a predetermined trigger point, the boost converter 226 charges battery 220 with a boosted voltage V2 and maintains battery switch 222 in an open state so that first internal bus 214 is powered by preregulator 210, rather than battery 220. In a second state of operation commanded when the preregulator output voltage V1 is below the trigger point, the logic/control assembly 230 de-activates the boost converter 228 and couples the second bus 224 with the first bus 214 via the battery switch 222, thereby powering devices 104 from the battery 220.

Figure 3:
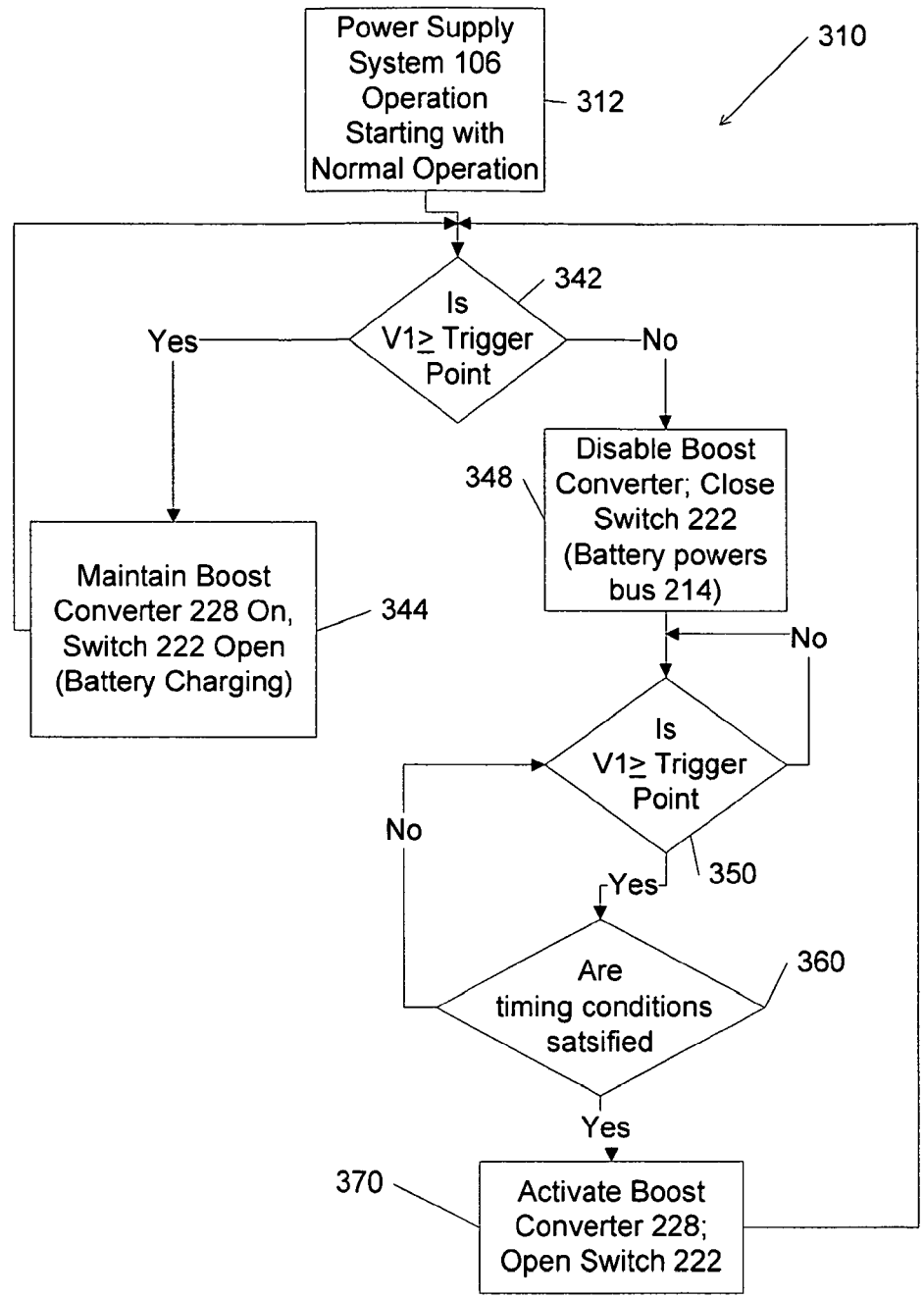
FIG. 3 is a flow diagram showing operation of the power supply unit in accordance with an embodiment of the disclosure.

FIG. 3 is a flow diagram showing an embodiment of a method of operating the power supply unit 106. The flow chart begins with unit 106 in the first operational state, its most typical condition, receiving above-trigger point voltage on bus 108 and with boost converter 228 activated and switch 222 closed. In the next instant, the logic control assembly 230 detects whether the preregulator output voltage V1 is still above the trigger point (block 342), indicating an adequate voltage V1. If it is, nothing is changed (block 344). If the first bus voltage V1 is less than the predetermined trigger point, the second operational state is commanded. Boost converter 228 is disabled and the battery switch 222 is closed (block 348). In this second state, the battery 220 drives the first bus 214, thereby powering devices 104. From this state, V1 is tested against the trigger point (block 350). The diode 216 permits a higher voltage to exist on bus 214 than at the output of preregulator 210. This is essential for sensing the restoration of preregulator output voltage after a voltage low condition. (decision box 350). When V1 again rises above the trigger point, it is determined if time conditions have been met (decision box 360) to switch back to the first state (block 370), in which converter 228 is activated and 222 is closed.

The time conditions of decision box 360 are designed to prevent a rapid toggling between states. If, for example, V1 has been lowered due to a current demand from another device, the removal of the load of power supply 106 may be enough to cause the V1 to recover in, for example, a millisecond. If there were no timing conditions, this would cause converter 228 to be immediately reactivated, causing V1 to go low again in, for example, a millisecond. In this manner unit 106 could oscillate between states at a 0.5 mHz rate, which would be harmful to system operation. In one preferred embodiment a one second timeout is implemented from the time converter 228 is deactivated, to the time when it may be reactivated. Typically battery 220 stores enough charge so that the timeout period could be made quite a bit longer than one second, without threatening to drain battery 220. In a preferred embodiment, timing conditions are set to match the characteristics of the overall system. In many embodiments the timeout function is performed by a hysteresis circuit associated to the boost converter 226. In other preferred embodiments, the timeout function is performed by the logic/control assembly 230.

Figure 4:
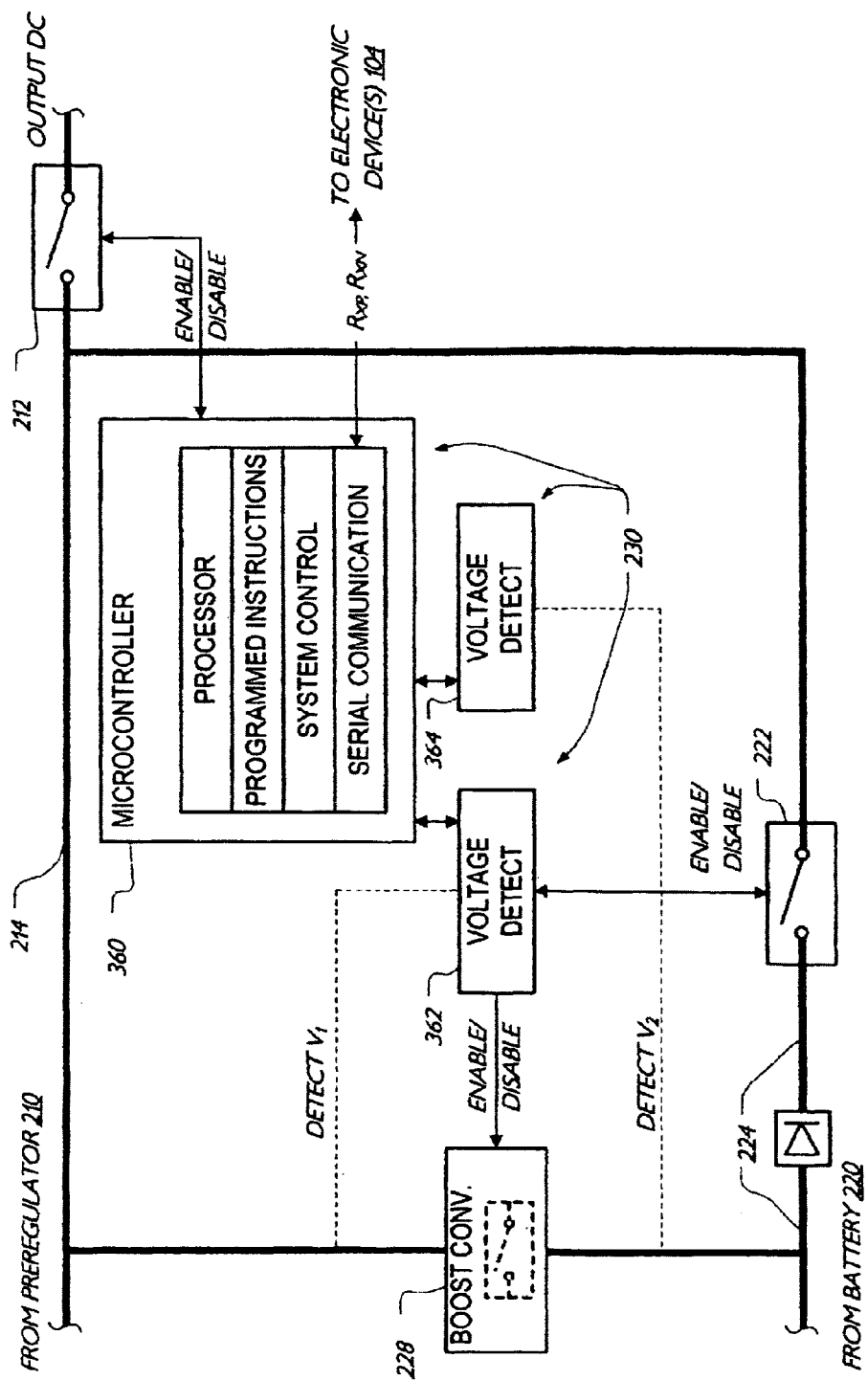
FIG. 4 is a schematic diagram of the power supply assembly in accordance with an embodiment of the disclosure.

FIG. 4 is a schematic diagram of components of the power supply unit 106, including the first and second busses 214 and 224, the boost converter 228, the switches 212 and 222, and individual logic/control components 230. More specifically, the logic control components 230 include a microcontroller 360 and voltage detect components 362 and 364 hardware wired to the enables of the boost converter 228 and the battery switch 222, respectively (in many embodiments, the boost converter 228 and the battery switch 222 can also be coupled to the microcontroller 360). In general, the microcontroller 360 includes a processor, associated program instructions, and system control and serial communication components. The voltage detect component 362 can measure whether the first bus voltage V1 is at or above the trigger point voltage, and the microcontroller 360 can enable the battery switch 222 and the boost converter 228 based on the detected first bus voltage V1. The voltage detect component 364, on the other hand, can measure the voltage level of the second bus 224 and/or the battery 220. For example, the microcontroller 360 can use the voltage detect component 364 to determine whether the battery 220 is operational and/or to determine charge level at the battery In many embodiments, the microcontroller 360 can also enable the main switch 212 depending on the state of the first and/or second busses 214 and 224. If the electronic device 104 is a PC motherboard, for example, the microcontroller 360 can be configured to disable the standby or sleep voltage demand of the power supplied to the motherboard by disabling the main switch 212 only after the motherboard has communicated to the microcontroller 360 that it is completely shut down. In such an example, the motherboard may have one of two interactive logic level bits attached to the front panel header. One bit is an LED output for "CPU-on" and the other is a front panel switch input bit.

The microcontroller 360 can be configured to sense the voltage at the first bus 214, interpret this as a "computer-on" command and activate the motherboard. To do this, the microcontroller 360 can pulse an off/on switch bit on the motherboard and also verify at the "CPU-on" output that the motherboard has booted. For example, whenever the input bus 108 (or first bus 214) is powered, the microcontroller 360 can be configured to verify that the motherboard is running or needs to be booted. When the input bus 108 (or first bus 214) has been down for a predetermined amount of time, the microcontroller 360 can interpret this is a command to "turn off" the motherboard and do so by pulsing the on/off front panel bit on the motherboard and request a shutdown from a (power aware) operating system. Battery 220 provides power during an orderly motherboard "turn off" sequence. One aspect of such a configuration of the microcontroller 360 is that many or all of processes carried out by the power supply unit 106 use no (or limited) software drivers, and system control can accordingly be carried out exclusively in hardware, based on the state of power at the input bus 108 and the operating state of the motherboard. This eliminates the need for a third wire, needed to indicate the beginning of a "turn off" sequence, that complicates prior art designs.

The above described system addresses numerous deficiencies in previously available power supply systems. For example, conventional power supplies use a boost converter-regulated front-end to maintain a tightly regulated intermediate bus voltage during DC power deviation or "sag" at the main bus. Such a topology demands proportionally increased current from the main bus in order to offset voltage sag. This creates a conflict condition when another device on the main bus is demanding high current, resulting in neither device being able to draw enough current to maintain its required internal voltage. Also, although the typical boost converter includes storage capacitors to provide power during power interrupts, these capacitors are quickly drained, again resulting in an insufficient intermediate bus voltage. Additionally, although existing uninterruptible power supply (UPS) systems include a battery, the battery is typically in-line-float-charged from the boost converter. Such an arrangement causes the battery to always be in-circuit and prevents the battery from being charged at the optimum charge voltage level. This compromises the life of a conventional battery system and the ability to meet current demand. Furthermore, conventional (controllable) DC based power supplies use fixed timers to control the shutdown and/or reboot sequences and times and are not interactive with external devices or components of an external device (e.g., a motherboard). In general, these supplies require a 'three wire' connection with a user switch for shutdown activation, and they have no user communication ports for real-time parameter changes or to control sequences of operation.

Embodiments of the power supply unit 106, however, mitigate these and other issues associated with conventional power supplies and converters. For example, the boost converter 228 is disabled when the main bus voltage drops below a programmable trigger point, reducing current demand from the pre-regulator 210 and thereby avoiding competition with other devices for main bus current. During these periods switch 222 is closed, permitting battery 220 to maintain proper voltage on intermediate bus 214 for far longer than do the converter storage capacitors in existing systems. Battery 220 is either supplying power or being charged at an ideal charging voltage. This preserves battery life and maximized the probability that when the battery is called upon to supply power it will be able to do so adequately.

Figure 5:
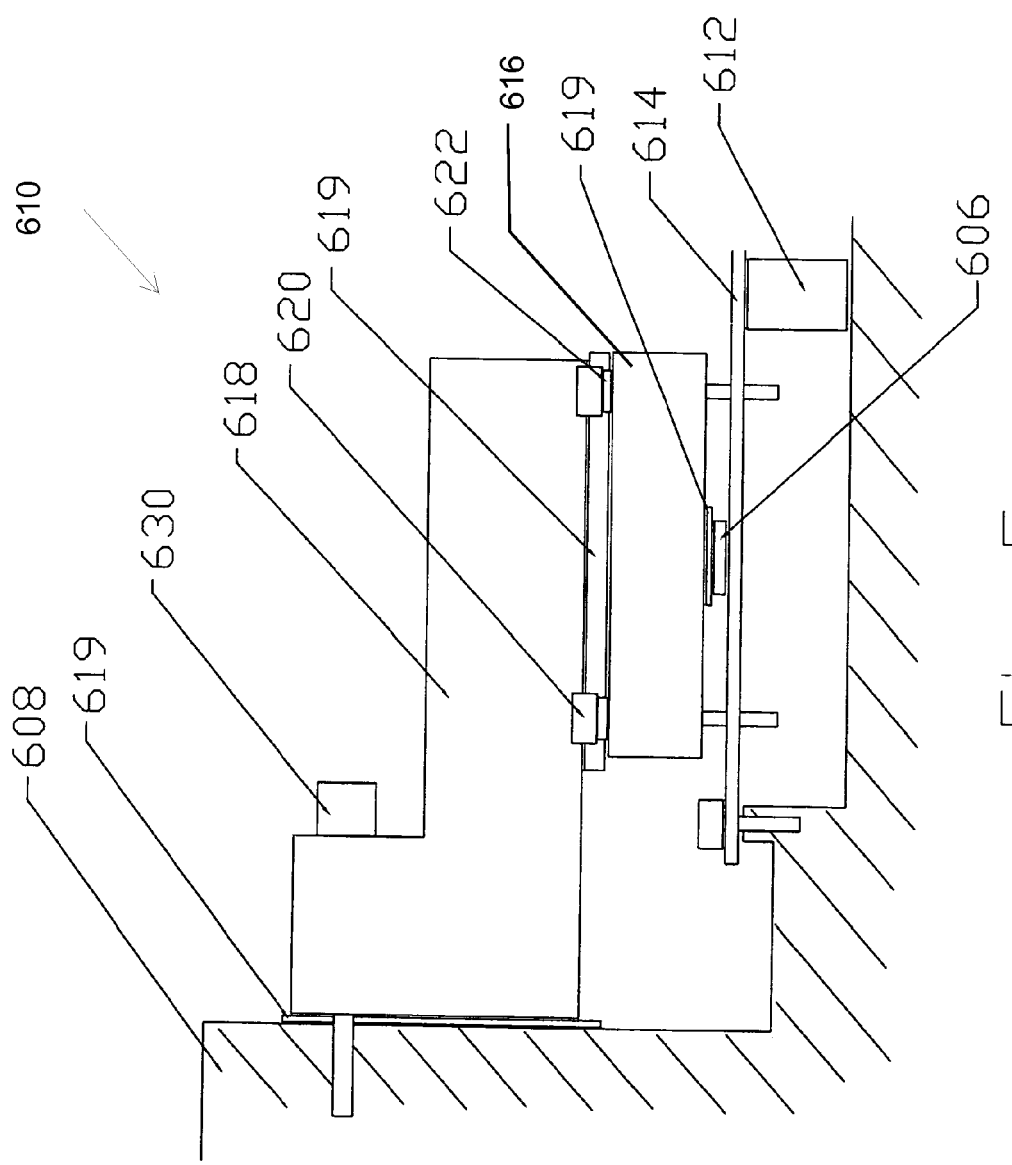
FIG. 5 is a side cross-sectional view of an integrated circuit and a thermal assembly designed to absorb heat therefrom.
Figure 6:
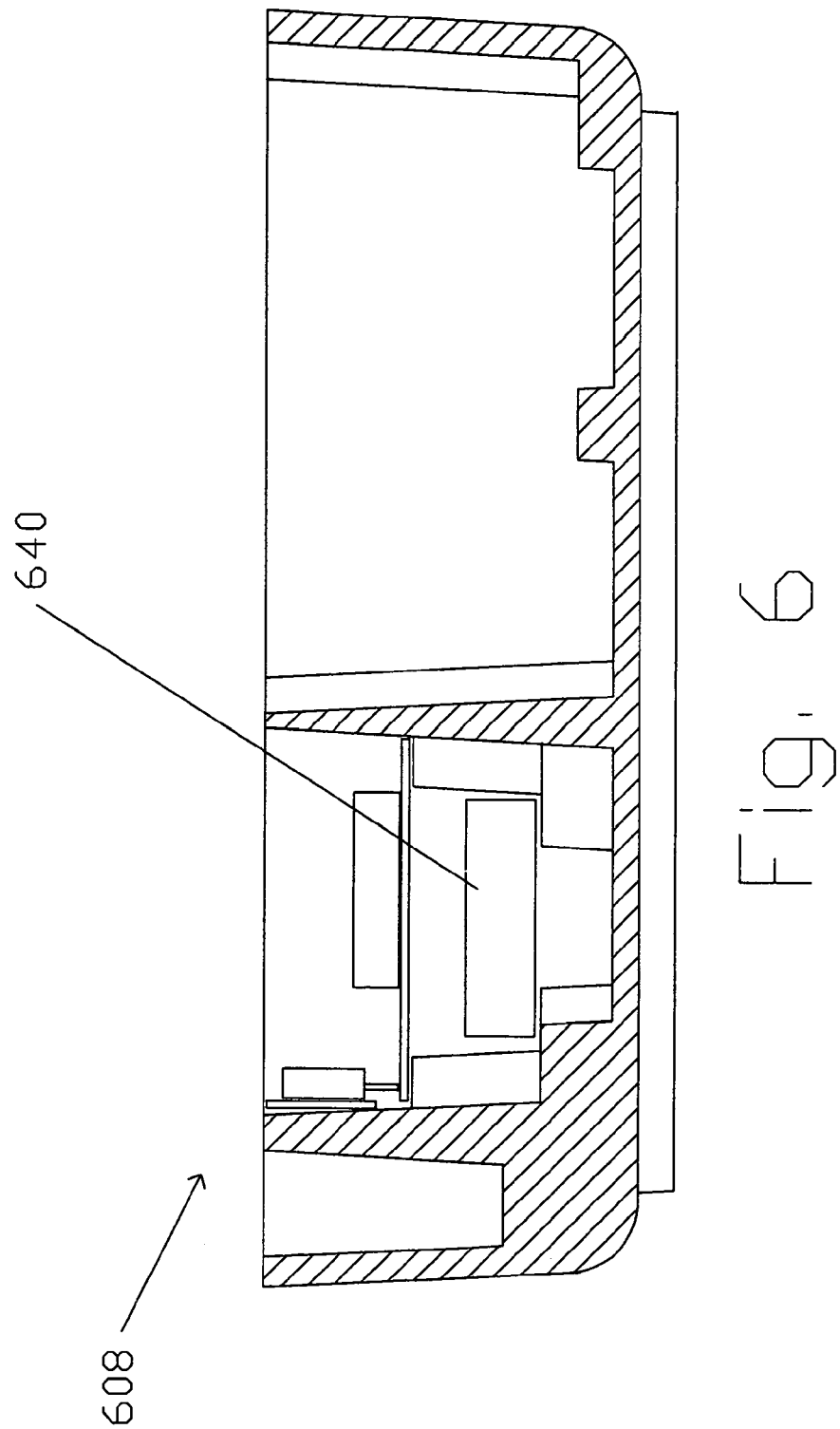
FIG. 6 is a cross-section plan view of a liquid-tight computer case and fan, according to the present invention.

Referring to FIGS. 5 and 6, the electrical network described above finds application in a rugged computer system. In a preferred embodiment, this system includes a processor integrated circuit (IC) 606 and two hard disk drives sealed within a metal case 608 (FIG. 6). One challenge in providing a system of this type is cooling and providing thermal stability for the electrical components without a capability of blowing air in from the outside. To meet the need of cooling the processor IC 606, a thermal assembly 610 is provided. This system includes the IC 606, which is electrically and physically connected to a printed circuit board (PCB) substrate 614 by a set of solder balls (not shown). A slide plate 616 is positioned above and placed in thermal contact with the IC 606. In turn, a thermal mass 618 is positioned above and placed in thermal contact with the slide plate 616. Finally, the thermal mass 618 is in thermal contact with the case 608. Thermal grease 619 is interposed between and permits thermal flow between the four components 606, 616, 618 and 608. Accordingly, the heat produced by IC 606 flows to slide plate 616, from whence it flows to thermal mass 618, and then to case 608. Thermal mass 618 also acts as a heat reservoir, changing only slowly and preventing an overly rapid change in the temperature of IC 606. The whole assembly 610 must maintain a tension to resist shock and vibration so elastomeric bumpers 612 are used to help constrain the PCB substrate 614 and to dampen vibration.

A great challenge in the design of thermal assembly is avoiding physical damage to the system, in particular to the solder balls connecting IC 606 to PCB substrate 614. If permitted, in the environment of physical shocks in which the rugged computer is designed to be deployed, the physical mass of thermal mass 618 could easily impact slide plate 616 into IC 606, thereby crushing the solder balls or cracking IC 606. Also the heating and cooling of the product over its lifetime will expand and contract the internal parts at different rates creating shear conditions on the connections to the IC 606. To prevent damage to the solder balls, slide plate 616 is mounted from pins 620 mounted in PCB substrate 614 and is suspended from pins 620 by tension springs 622. Accordingly, slide plate 616 can ride up and down with IC 606 and shift in coplanar dimension relative to the contact surfaces of IC 606, thereby avoiding stress to the solder balls and to IC 606.

Thermal mass 618 is fastened to the case 608 by stud 630. This connection suspends mass 618 over slide plate 616, to control the pressure of mass 618 on slide plate 616. As noted, thermal contact is maintained between mass 618 and slide plate 616 by thermal grease 619, which permits relative movement between the two components.

Referring specifically to FIG. 6, the above described assembly is housed in case 608 (bottom half shown), which has an internal fan 640 to blow air through a series of plenums, thereby distributing heat throughout the system, and stabilizing any heat contributions not already mechanically connected to the thermal structure. In a preferred embodiment, IC 606 produces 35 Watts of heat at full operation and assembly 610 (including case 608) takes 7 hours for its temperature to be elevated from a starting temperature of 15° C. to 50° C. The temperature of assembly 610 thereafter remains at a stable 50° C. in ambient air temperatures of up to 30° C. Moreover, a preferred embodiment includes a chip set that supports IC 606 and that also requires a thermal stack, similar to assembly 610 to remove heat and lessen thermal cycling while avoiding physical damage. In this embodiment slide plate 616 and thermal mass 618 are made of 2024 aluminum alloy, case 608 is of cast aluminum. Slide plate 616 has a mass of 40.8 grams for the CPU assembly 610 and 49.9 grams for the parallel assembly for the chip set. Also, thermal mass 618 has a mass of 99.8 grams for the CPU assembly 610 and 136.1 grams for the parallel assembly for the chip set. Finally, case 608 has a mass of 2536 grams and a surface area of 1332.4 $cm^2$.

From the foregoing, it will be appreciated that representative embodiments have been described herein for purposes of illustration, but that various modifications may be made to these embodiments, including adding and/or eliminating particular features. For example, in some embodiments the main switch 212 can be omitted. Also, in other embodiments, the logic/control components 230 may include other components and/or configurations. For example, one or more of the voltage detect circuits 362 and 364 can be functionally programmed into the microcontroller 360 (see also Appendix C). In addition, while representative examples of the system were described above in the context of DC power, other embodiments may include other types of power, such as DC-pulsed power or AC power. Further, while advantages associated with certain embodiments have been described in the context of those embodiments, other embodiments may also exhibit such advantages, and not all embodiments need necessarily exhibit such advantages to fall within the scope of the invention. The following examples and appendices provide further representative embodiments.

The invention claimed is:

1. A mechanical and thermal assembly in thermal contact with a delicate, heat-producing structure having a planar surface, and comprising:
   (a) a slide plate in thermal contact to said planar surface, and being held in place by a resilient system that permits, but gently resists, movement perpendicular to said planar surface; and
   (b) a thermally conductive metal case having an interior surface and a thermal mass made of thermally conductive metal, suspended from said interior surface of said metal case over said slide plate, but in thermal contact to said slide plate, so that said delicate, heat-producing structure is not damaged due to force applied from said thermal mass through said slide plate to said structure, but whereby said thermal mass enhances the thermal stability of said heat-producing structure.

2. The mechanical and thermal assembly of claim 1, further including a case enclosing said delicate, heat-producing structure, said slide plate and said thermal mass.

3. The mechanical and thermal assembly of claim 2, wherein said thermal mass is suspended from said case.

4. The mechanical and thermal assembly of claim 2, wherein said case is fluid-tight.

5. The mechanical and thermal assembly of claim 1, wherein thermally conductive grease is interposed between said delicate, heat-producing structure and said slide plate to facilitate transmission of heat while permitting separation between said delicate, heat-producing structure and said slide-plate.

6. The mechanical and thermal assembly of claim 1, wherein thermally conductive grease is interposed between said slide plate and said thermal mass, to facilitate transmission of heat, while permitting separation between said slide plate and said thermal mass.

7. A mechanical, electrical and thermal assembly comprising:
   (a) an electrical assembly, including a delicate, heat-producing integrated circuit having a planar surface;
   (b) a slide plate in thermal contact to said planar surface, and being held in place by a resilient system that permits, but gently resists, movement perpendicular to said planar surface; and
   (c) a thermally conductive metal case having an interior surface and a thermal mass made of thermally conductive metal, suspended from said interior surface of said metal case over said slide plate, but in thermal contact to said slide plate, so that said delicate, heat-producing integrated circuit is not damaged due to force applied from said thermal mass through said slide plate to said integrated circuit, but whereby said thermal mass enhances the thermal stability of said integrated circuit.

8. The mechanical and thermal assembly of claim 7, further including a case enclosing said delicate, heat-producing structure, said slide plate and said thermal mass.

9. The mechanical and thermal assembly of claim 8, wherein said thermal mass is suspended from said case.

10. The mechanical and thermal assembly of claim 8, wherein said case is fluid-tight.

11. The mechanical and thermal assembly of claim 7, wherein thermally conductive grease is interposed between said delicate, heat-producing structure and said slide plate to facilitate transmission of heat while permitting separation between said delicate, heat-producing structure and said slide-plate.

12. The mechanical and thermal assembly of claim 8, wherein thermally conductive grease is interposed between said slide plate and said thermal mass, to facilitate transmission of heat, while permitting separation between said slide plate and said thermal mass.

13. The assembly of claim 1, wherein said thermal mass is made of an aluminum alloy.

14. The assembly of claim 13, wherein said aluminum alloy is 2024 aluminum alloy.

15. The assembly of claim 1, wherein said thermal mass has a mass of about 100 grams.

16. The assembly of claim 1, wherein said thermal mass is suspended from said interior surface of said case at a single point, thereby permitting changes in relative orientation, between said thermal mass and said case.

17. The assembly of claim 7, wherein said thermal mass is made of an aluminum alloy.

18. The assembly of claim 17, wherein said aluminum alloy is 2024 aluminum alloy.

19. The assembly of claim 7, wherein said thermal mass has a mass of about 100 grams.

20. The assembly of claim 7, wherein said thermal mass is suspended from said interior surface of said case at a single point, thereby permitting changes in relative orientation, between said thermal mass and said case.

* * * * *